United States Patent
Choi et al.

[11] Patent Number: 6,075,284
[45] Date of Patent: Jun. 13, 2000

[54] STACK PACKAGE

[75] Inventors: Yoon Hwa Choi; Nam Soo Lee, both of Kyoungki-do, Rep. of Korea

[73] Assignee: Hyundai Electronics Industries Co., Ltd., Kyoungki-do, Rep. of Korea

[21] Appl. No.: 09/340,543

[22] Filed: Jun. 28, 1999

[30] Foreign Application Priority Data

Jun. 30, 1998 [KR] Rep. of Korea .................... 98-25771

[51] Int. Cl.[7] ................................................. H01L 23/495
[52] U.S. Cl. .......................... 257/676; 257/666; 257/787
[58] Field of Search .................... 257/666, 676, 257/787

[56] References Cited

U.S. PATENT DOCUMENTS

| | | | |
|---|---|---|---|
| 5,302,849 | 4/1994 | Cavasin . | |
| 5,327,327 | 7/1994 | Frew et al. ................................ | 361/784 |
| 5,343,366 | 8/1994 | Cipolla et al. ........................... | 361/785 |
| 5,514,907 | 5/1996 | Moshayedi ................................ | 257/723 |
| 5,600,541 | 2/1997 | Bone et al. ................................ | 361/707 |
| 5,612,570 | 3/1997 | Eide et al. ................................ | 257/686 |
| 5,770,888 | 6/1998 | Song et al. . | |
| 5,781,413 | 7/1998 | Howell et al. ........................... | 361/777 |
| 5,818,107 | 10/1998 | Pierson et al. ........................... | 257/723 |
| 5,821,625 | 10/1998 | Yoshida et al. .......................... | 257/777 |
| 5,898,212 | 4/1999 | Kim . | |

*Primary Examiner*—Sheila V. Clark
*Attorney, Agent, or Firm*—Ladas & Parry

[57] ABSTRACT

Disclosed is a stack package. In the stack package, at least two semiconductor chips 40 are disposed up and down. Inner leads 31 of lead frames 30 are attached at a bonding pad-disposed face of the semiconductor chip 40. The inner leads 31 are electrically connected to the bonding pads of the semiconductor chips 40 with metal wires 50. Protruding portions 33,34 are formed at the inner leads 31 toward downside and upside. To expose the respective protruding portions 33,34 and outer leads 32 formed at the lowermost lead frame 30, the respective semiconductor chips 40 are molded with an epoxy compound 60. The respective lead frames 30 are electrically connected by contacting the upwardly or downwardly protruding portions 34, 33 from the respective lead frames.

3 Claims, 11 Drawing Sheets

STACK PACKAGE

BACKGROUND OF THE INVENTION

1. Field of the Invention

The present invention generally relates to a semiconductor package, and more particularly to the stack package that one package consists at least two semiconductor chips stacked therein.

2. Description of the Related Art

Rapid progress in the memory chip has been presented to increase memory capacity. Currently, 128M DRAM is mass-produced, and also the mass-production of 256M DRAM will be available sooner or later.

For increasing memory chip capacity, i.e. high integration, a technology for inserting cells as many as possible into a given area of semiconductor device, is widely known. However, this method requires high technology such as a precise line width and a considerable amount of time for development. Accordingly, a relatively simpler stacking technology to optimize integrity of the semiconductor device has been developed most recently.

The term "stacking" used in semiconductor industry means a technique to double the memory capacity by heaping up at least two semiconductor chips in a vertical direction. According to the stacking technique, a 128M DRAM device can be constituted by two 64M DRAM devices for instance, also a 256M DRAM device can be constituted by two 128M DRAM devices.

Figure 1:
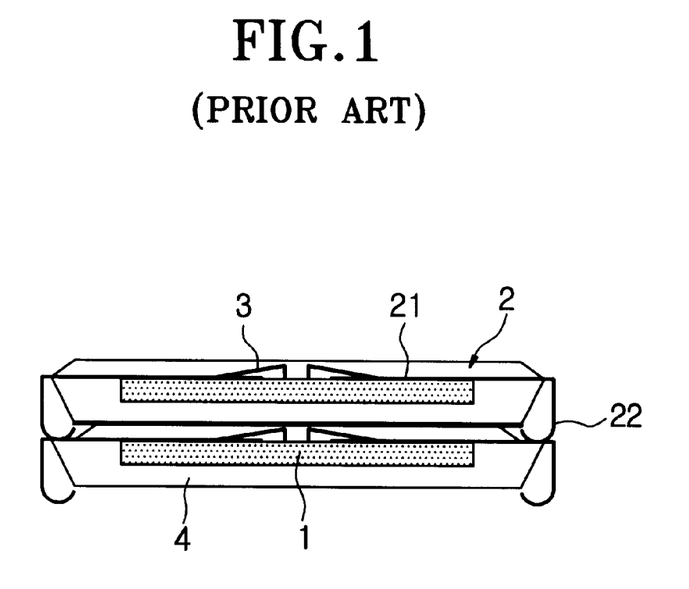
FIGS. 1 and 2 are cross-sectional views showing two types of conventional stack packages.

Merely an example of a package fabricated according to the typical stacking technique is illustrated in FIG. 1.

As shown in the drawing, an inner lead 21 of a lead frame 2 is attached by means of an adhesive to a semiconductor chip 1 in which a bonding pad is disposed on an upper portion of the semiconductor chip 1. The inner lead 21 is connected to the bonding pad with a metal wire 3. The entire resultant is molded with an epoxy compound 4 such that both ends of the outer lead 22 is exposed therefrom.

On the package as constituted above, another package having the same constitution as above is stacked. That is to say, the outer lead 22 of the package in the upper position is in contact with a midway portion of the lead frame 2 in the lower position thereby electrically connecting each other.

However, there is a drawback in the general stack package that total thickness of the package is too thick. Further, since an electrical signal should pass the lead frame of the lower package through the outer lead of the upper package, there is another drawback that the electrical signal path is too long. Especially, bad connections are occurred frequently due to bad soldering since leads of both upper and lower packages are joined with each other by soldering.

Figure 2:
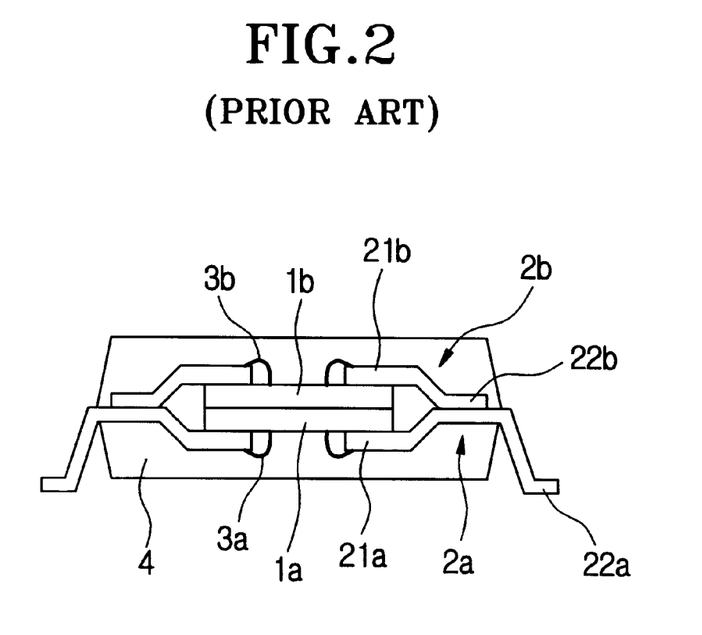

A conventional stack package to solve foregoing problems is illustrated in FIG. 2.

As shown in the drawing, the respective back sides of upper and lower semiconductor chips 1b,1a are attached with an adhesive. An inner lead 21b of an upper lead frame 2b is attached on the top surface of the upper semiconductor chip 1b, thereby electrically connecting the inner lead 21b and bonding pad with a metal wire 3b. Further, the inner lead 21a of a lower lead frame 2a is attached on the bottom surface of the lower semiconductor chips 1a thereby electrically connecting the inner lead 21a and the bonding pad with a metal wire 3a. An outer lead 22b of upper lead frame 2b is bonded at a midway portion of the lower lead frame 2a and the entire resultant is molded with an epoxy compound 4 such that an outer lead 22a of the lower lead frame 2a is exposed therefrom.

This type of stack package often shortens the electrical signal path. However, even one between two semiconductor chips has bad function, then two semiconductor chips are all abandoned since a connecting portion between upper and lower lead frames 2a,2b is located within the epoxy compound 4.

SUMMARY OF THE INVENTION

Accordingly, the present invention is related to a method to solve the foregoing problems.

It is the object of the present invention to provide a stack package that maintains its short electrical signal path and separates semiconductor chips with ease. Accordingly, in this package the entire semiconductor chips may not be abandoned even when one among the semiconductor chips is bad.

To accomplish the object, the stack package of the present invention has following constitutions.

At least two semiconductor chips are stacked up and down. Inner leads are attached to the respective bonding pad-disposed faces of the semiconductor chips. The inner leads are electrically connected to the bonding pads of the semiconductor chips with metal wires. Protruding portions toward upside and downside are formed in the inner leads respectively. The semiconductor chips are molded with an epoxy compound respectively such that each protruding portion and an outer lead of the lead frame being positioned at the bottom are exposed thereby completing a package.

Two packages having the above constitutions are stacked. Namely, there is formed a stack package in that the respective protruding portions of the inner leads of the lead frames toward upside are connected each other, or the respective protruding portions of the inner leads of the lead frames toward downside are connected each other.

In another aspect, instead of the lead frames having no outer lead, the protruding portion being extended upward from the lead frames are disposed toward lower portion, and solder balls to be installed at the substrate may be mounted at the protruding portions.

According to the foregoing constitutions of the present invention, the packages are stacked by connecting the protruding portions formed at the respective lead frames. Although one among the semiconductor chips is bad, other semiconductor chips can be used by separating the connection between the protruding portions since it is easy to separate the respective packages.

DETAILED DESCRIPTION OF THE PREFERRED EMBODIMENTS

[Embodiment 1]

FIGS. 3 to 12 illustrate the manufacturing process of the stack package according to a first embodiment of the present invention successively, and the letter "A" means for a cross-sectional view and the letter "B" means for a perspective view. Hereinafter, those letters "A" and "B" will be omitted.

Figure 3A:
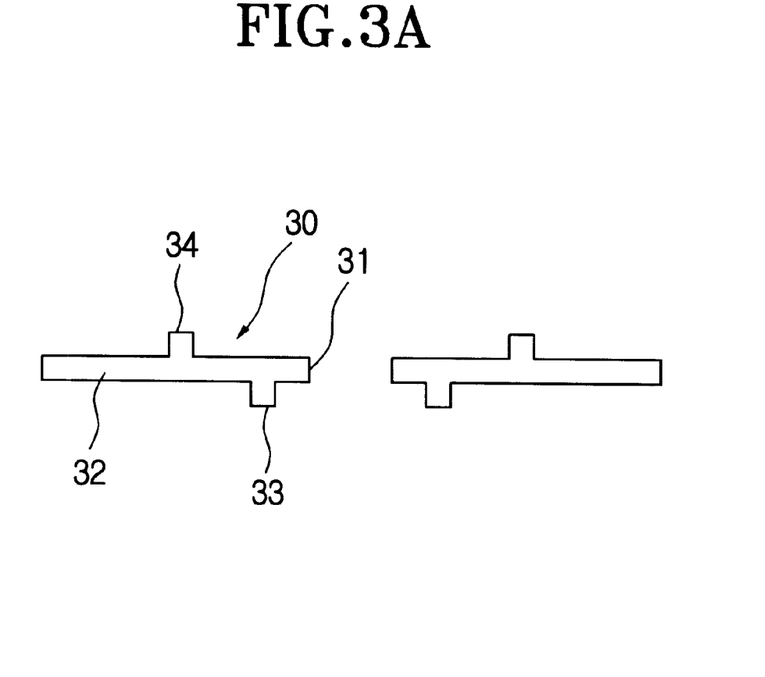
FIGS. 3A, 3B, 4A, 4B, 5A, 5B, 6A, 6B, 7A, 7B, 8A, 8B, 9, 10A, 10B, 11A, 11B, 12A and 12B illustrate the manufacturing process of the stack package according to a first embodiment of the present invention successively, and the letter "A" means for a cross-sectional view and the letter "B" means for a perspective view.
Figure 3B:
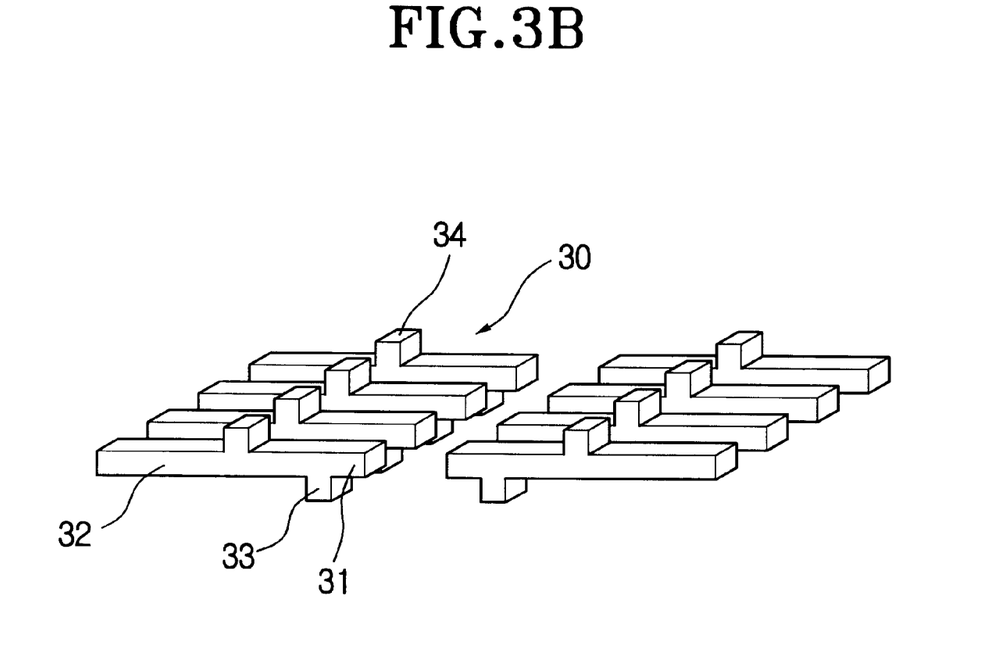

First of all, as shown in FIG. 3, a lead frame 30 comprising an inner lead 31 and an outer lead 32 are fabricated. A downwardly protruding portion 33 and an upwardly protruding portion 34 are formed at the inner lead 31 respectively. More concretely, the downwardly protruding portion 33 is formed at the innermost region of the inner lead 31 and the upwardly protruding portion 34 is formed at the outermost region of the same that is extended to the outer lead 32. Upon viewing the lead frame 30 overall, the upwardly protruding portion 34 is formed at a midway portion of the lead frame 30.

Figure 4A:
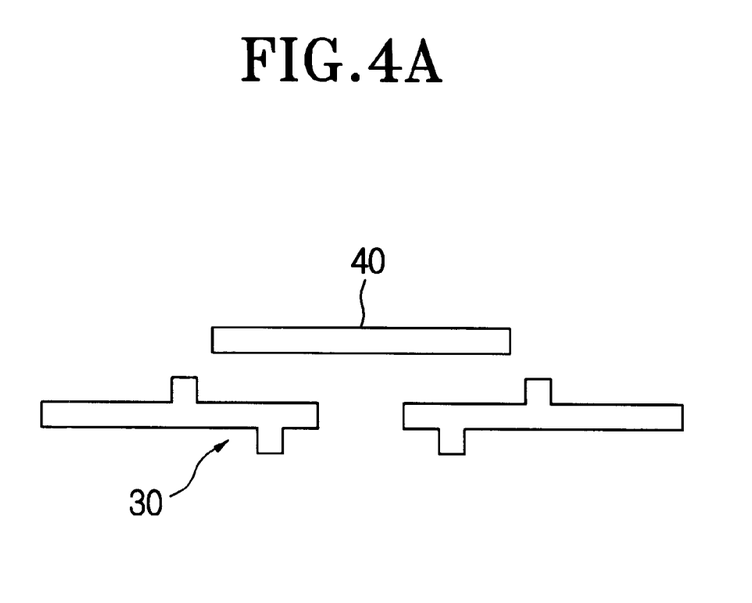
Figure 4B:
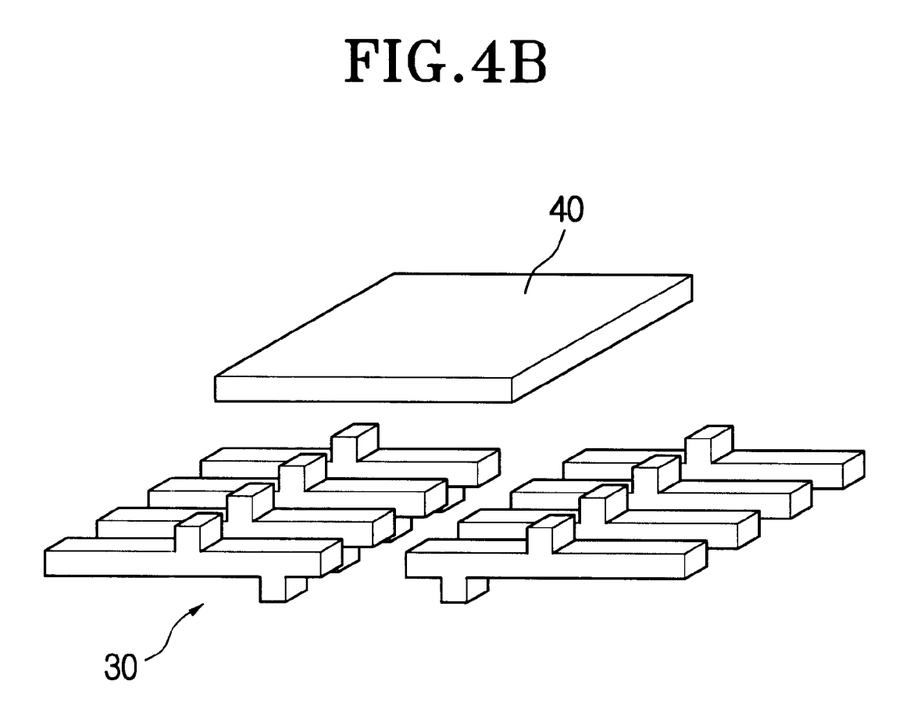
Figure 5A:
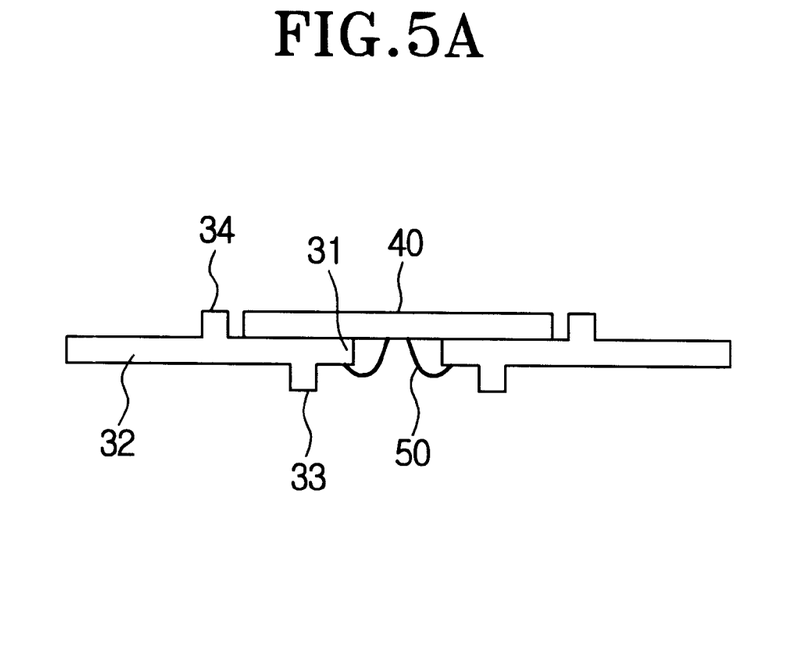
Figure 5B:
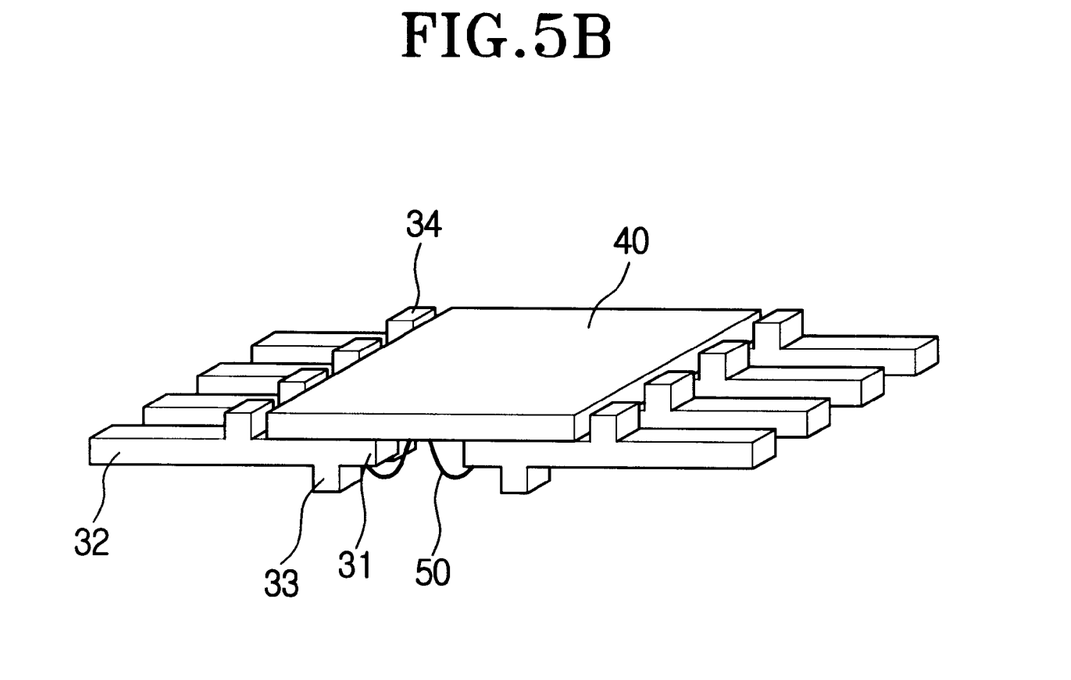

And then, as shown in FIG. 4, a semiconductor chip 40 is entered between the respective upwardly protruding portions 34 of both lead frames 34 and as shown in FIG. 5, the semiconductor chip 40 is attached to the inner lead 31. Next, a bonding pad of the semiconductor chip 40 and the inner leads 31 of the respective lead frames 30 are connected with metal wires 50.

Figure 6A:
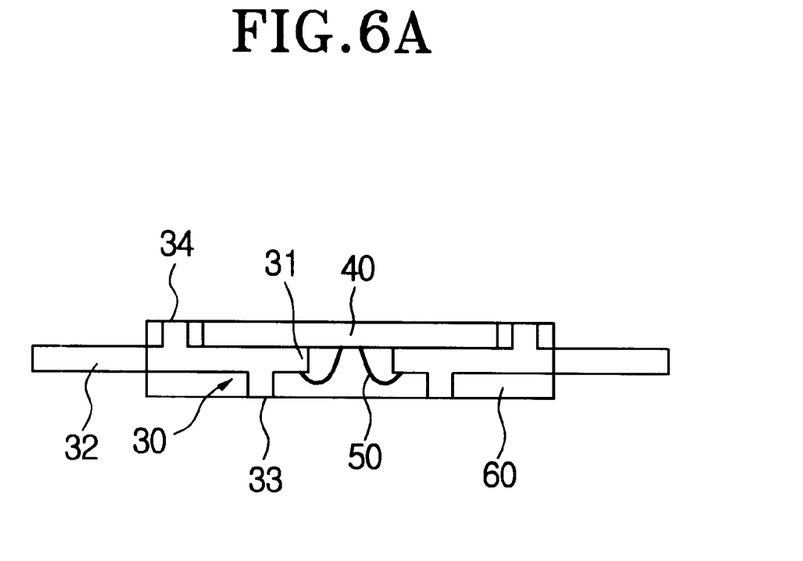
Figure 6B:
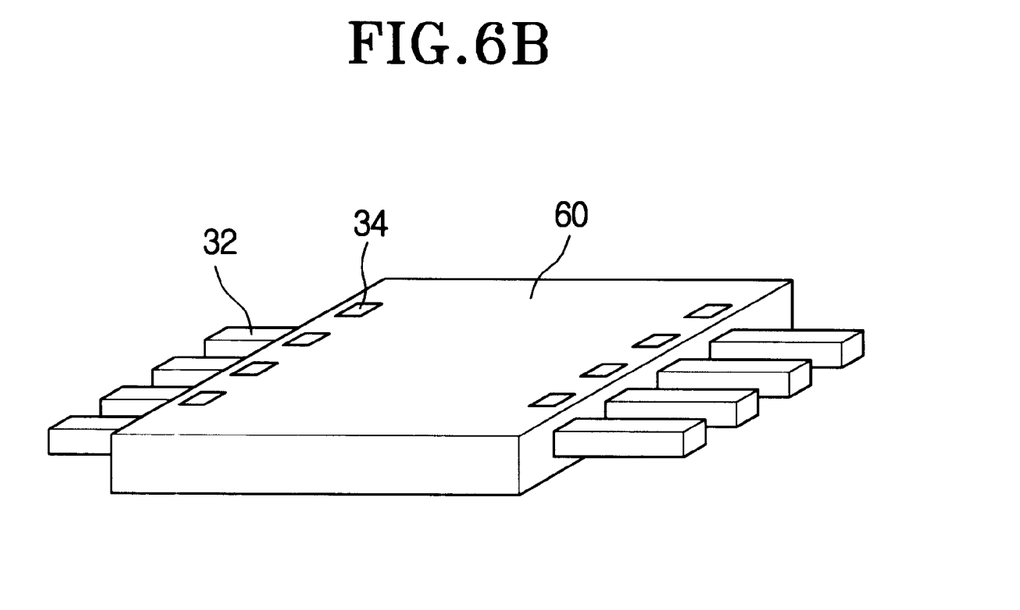

Afterward, the entire structure is molded with an epoxy compound 60 as shown in FIG. 6. Both ends of the outer lead 32 and the respective downwardly and upwardly protruding portions 33,34 are exposed from the epoxy compound 60. When this structure is completed, a stack package capable of stacking a plurality of packages is accomplished.

Figure 7A:
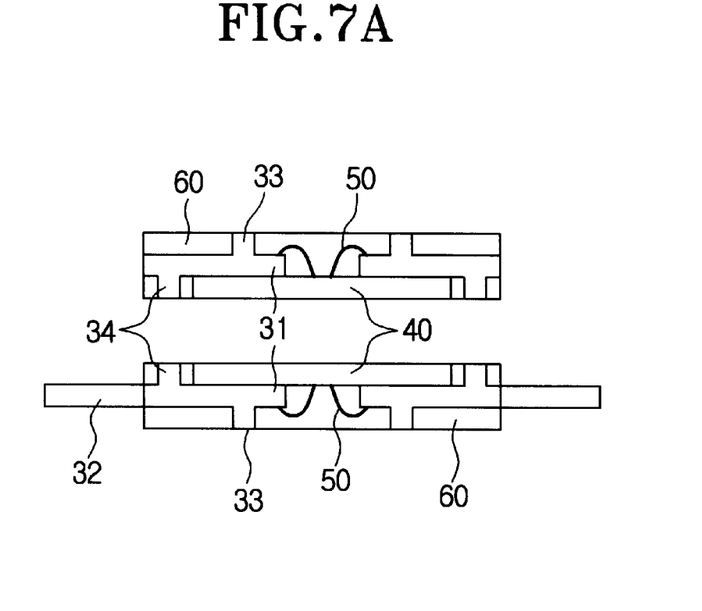
Figure 7B:
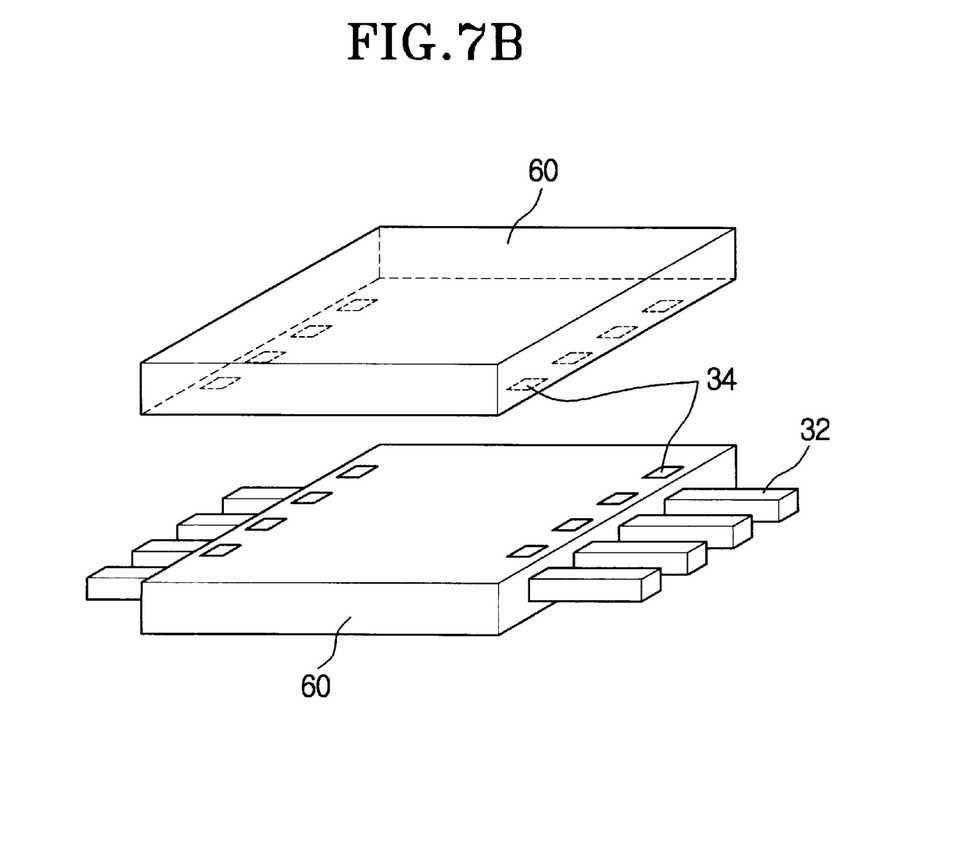
Figure 8A:
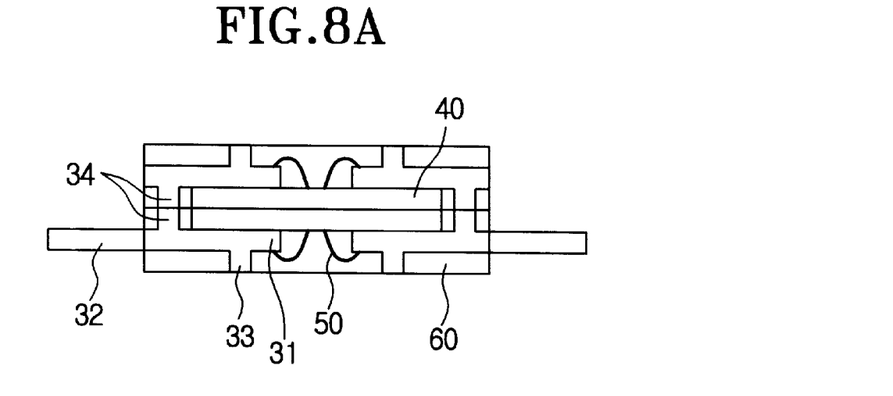
Figure 8B:
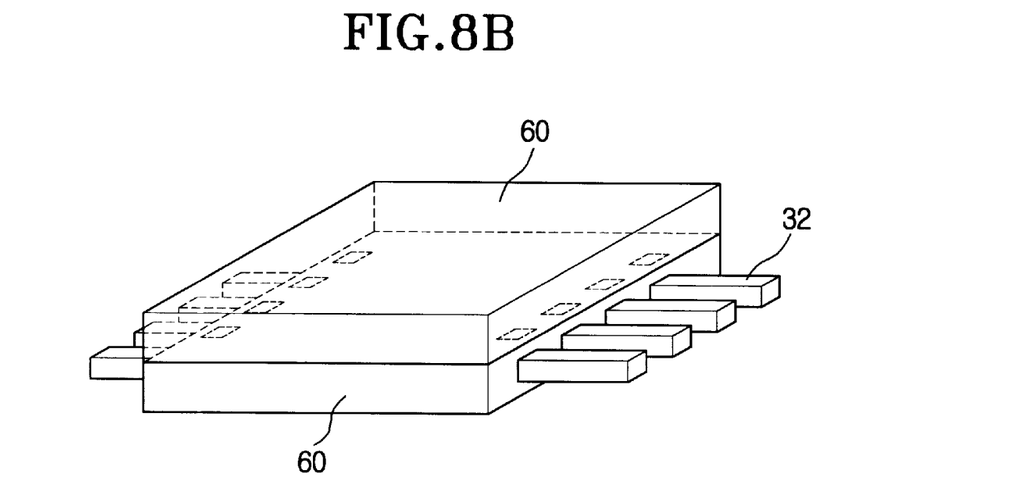
Figure 9:
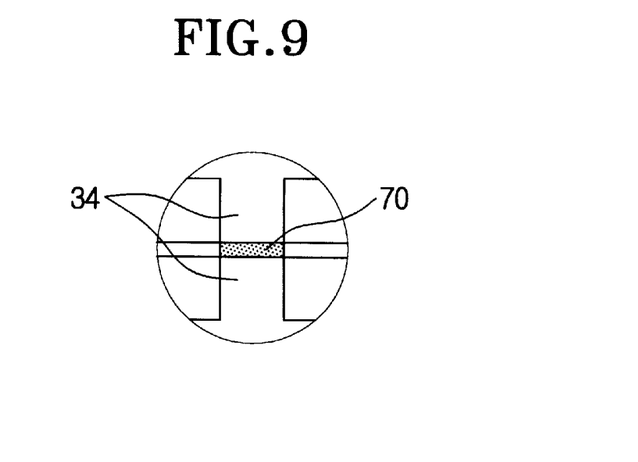

That is to say, as shown in FIG. 7, another package being upset as fabricated according to the above processes is stacked on the package which was fabricated earlier. Herein, the package which is not mounted on a printed circuit board directly, i.e. the upper package has lead frames having no outer lead. Then, as shown in FIG. 8, the upwardly protruding portion 34 of the respective lead frames 30 are connected each other thereby electrically connecting the respective lead frames 30. Especially, the respective protruding portions 34 are attached, as shown in FIG. 9 by means of a conductive resin 70 such as the conductive epoxy or a conductive solder paste.

Although the stacking of two packages are described, still another package having the same constitution can be further stacked at the stack package according to the present invention.

Figure 10A:
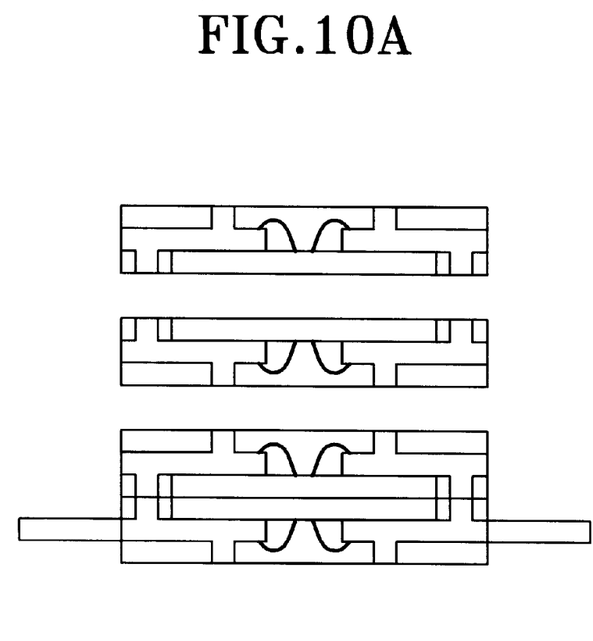
Figure 10B:
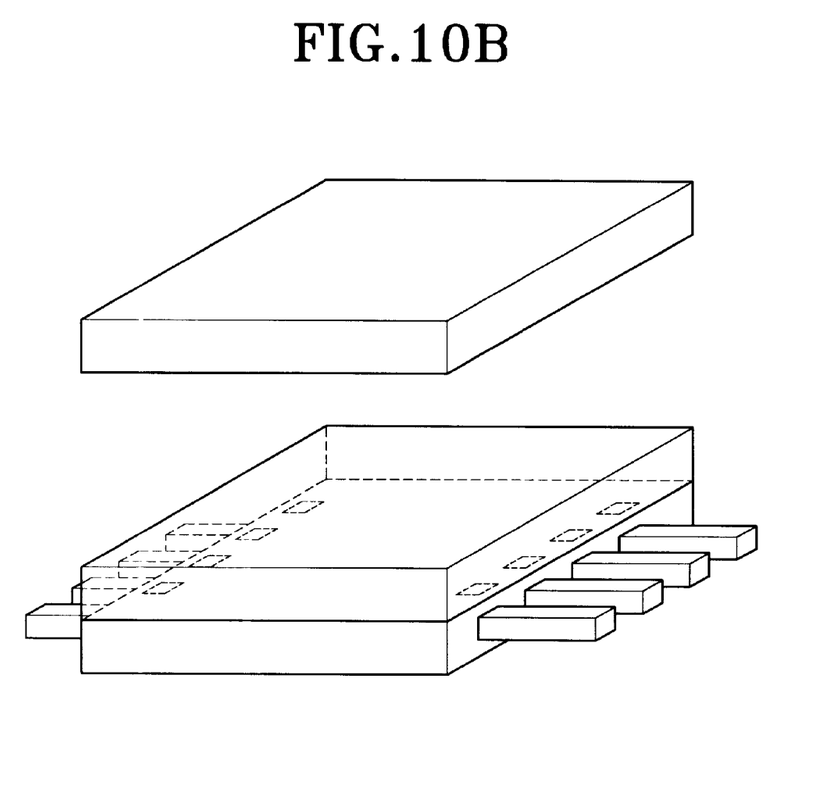
Figure 11A:
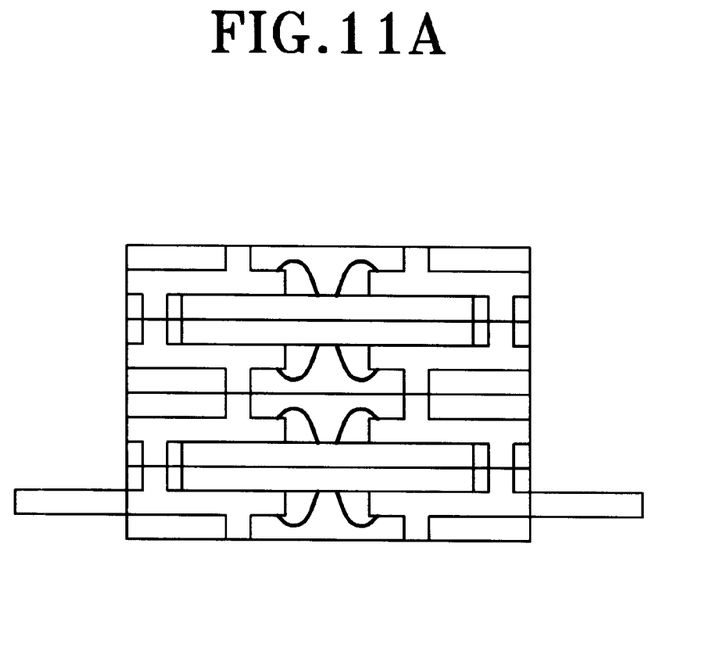
Figure 11B:
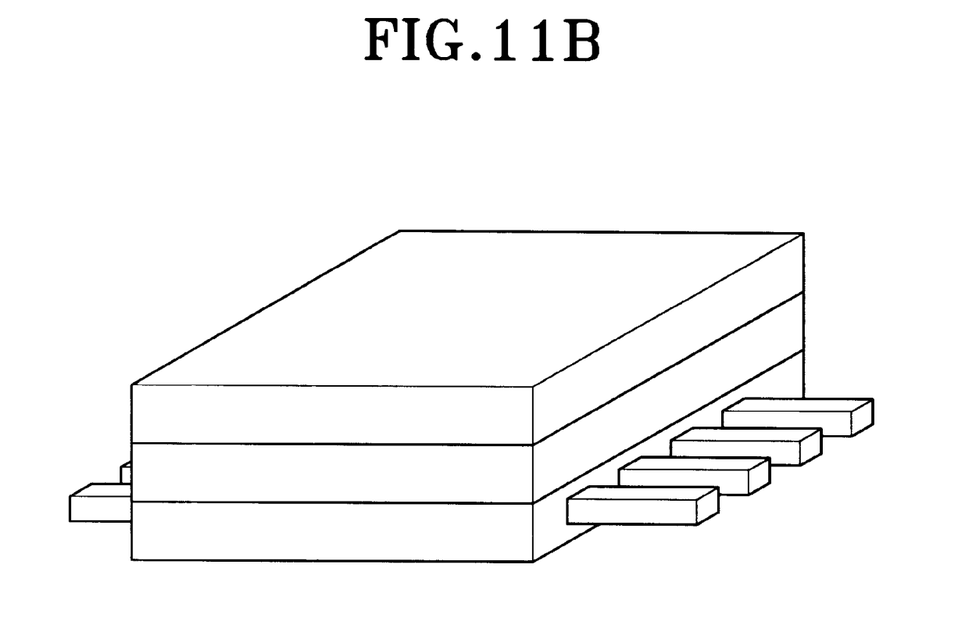

That is to say, as shown in FIG. 10, another package having the same constitution as described above is stacked on the two stacked packages without upsetting. Then, as shown in FIG. 11, the respective downwardly protruding portions 33 are in contact with each other thereby electrically connecting the lead frames 30 of the respective packages.

So far the stacking of three packages are described, however, one upset package and another normal package can be stacked continuously.

Figure 12A:
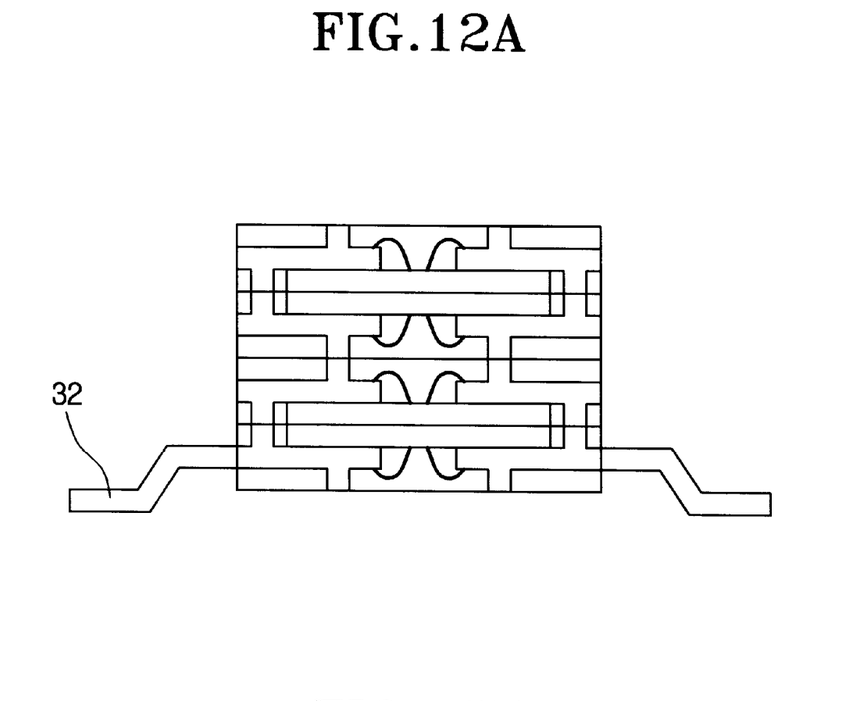
Figure 12B:
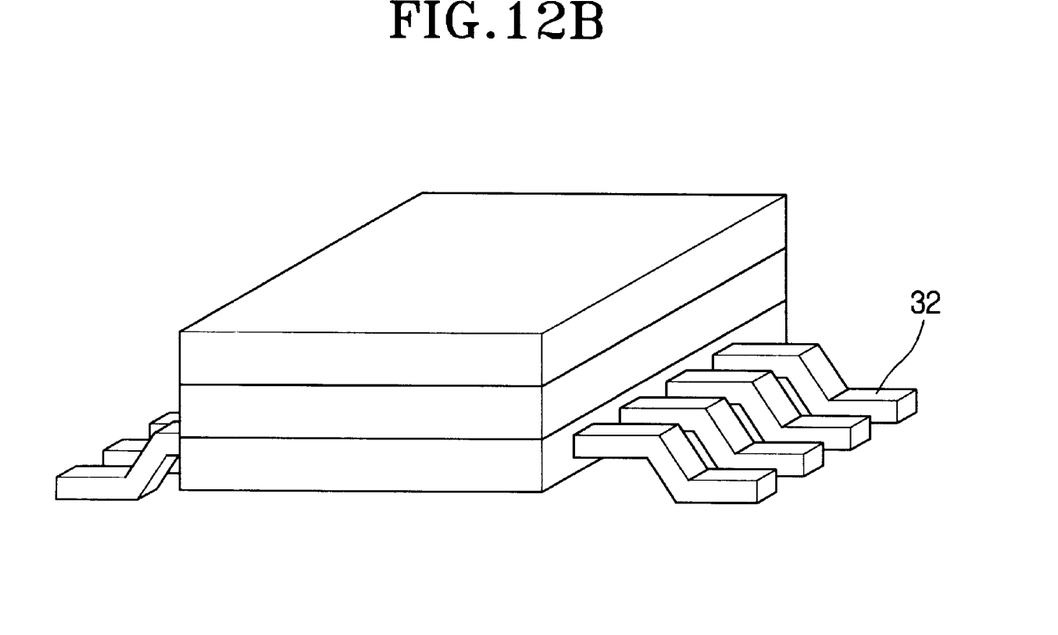

Finally referring to FIG. 12, the outer lead 32 of the package at the lowermost portion is formed in a shape of the letter "J" so that their outer leads 32 are mounted on the printed circuit board.

[Embodiment 2]

Figure 13:
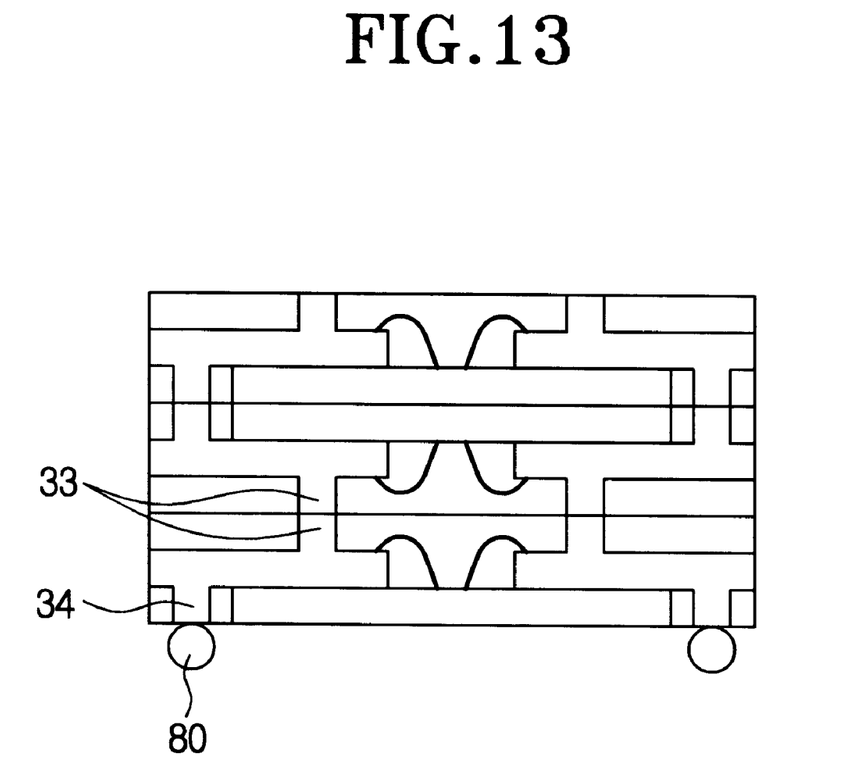
FIG. 13 is a cross-sectional view showing a stack package according to a second embodiment of the present invention.

FIG. 13 is a cross-sectional view showing a stack package according to a second embodiment of the present invention. As shown in the drawing, three packages as described above are stacked. However, the lead frame 30 at the lowermost position has no outer lead likewise other lead frames 30. Instead of the outer lead, the lead frame at the lowermost position is disposed such that its upwardly protruding portion 34 is exposed from the epoxy compound 60 toward the bottom faces. A solder ball 80 for mounting at the substrate is mounted on the exposed upwardly protruding portion 34. This type of package may reduce more loading dimension than the package according to the first embodiment.

According to the present invention as described above, the electrical signal transmitting path between the stacked packages is maintained short and the electrical contact faces of the respective lead frames are positioned outside of the epoxy compound. Consequently, although one among the semiconductor chips is bad, other semiconductor chips can be used by separating the connection between the protruding portions since it is easy to separate the respective packages.

Although preferred embodiments of the stack package are described and illustrated, various other modifications will be apparent to and can be readily made by those skilled in the art without departing from the scope and spirit of the present invention.

What is claimed is:

1. A stack package comprising:

at least two semiconductor chips disposed up and down;

lead frames having inner leads attached at bonding pad-disposed faces of the semiconductor chips respectively, wherein a pair of protruding portions are formed at the inner leads toward upside and downside respectively, wherein among the lead frames of the semiconductor chips, only one at the lowermost position of the semiconductor chips comprises outer leads being extended from the inner leads and to be mounted on a printed circuit board;

metal wires for electrically connecting the inner leads of the respective lead frames and bonding pads of the semiconductor chips; and an epoxy compound for separately molding the respective semiconductor chips so that the outer leads and the protruding portions are exposed therefrom, wherein the respective lead frames are electrically connected by connecting the respective protruding portions of the lead frames being exposed from the epoxy compound.

2. The stack package of claim 1, wherein the respective protruding portions are attached by means of a conductive solder paste or a conductive epoxy.

3. A stack package comprising:

at least two semiconductor chips disposed up and down;

lead frames having only inner leads attached at bonding pad-disposed faces of the semiconductor chips respectively, wherein a pair of protruding portions are formed at the inner leads toward upside and downside respectively;

a metal wire for electrically connecting the inner leads of the respective lead frames and bonding pads of the semiconductor chips;

an epoxy compound for separately molding the respective semiconductor chips so that the protruding portions are exposed therefrom; and solder balls mounted on the protruding portions of a lead frame which is positioned at the lowermost position among the lead frames and exposed from the epoxy compound; and wherein the respective lead frames are electrically connected by connecting the respective protruding portions of the lead frames in which no solder balls are mounted.

* * * * *